US008040143B2

(12) United States Patent
Nascimento

(10) Patent No.: US 8,040,143 B2
(45) Date of Patent: Oct. 18, 2011

(54) CAPACITANCE SENSING WITH MISMATCH COMPENSATION

(75) Inventor: Ivan Carlos Ribeiro do Nascimento, Campinas (BR)

(73) Assignee: Freescale Semiconductor, Inc., Austin, TX (US)

(*) Notice: Subject to any disclaimer, the term of this patent is extended or adjusted under 35 U.S.C. 154(b) by 134 days.

(21) Appl. No.: 12/570,765

(22) Filed: Sep. 30, 2009

(65) Prior Publication Data
US 2011/0074445 A1   Mar. 31, 2011

(51) Int. Cl.
G01R 27/26 (2006.01)
H03K 3/02 (2006.01)
(52) U.S. Cl. .......... 324/678; 324/658; 331/143; 331/46
(58) Field of Classification Search .................. 324/601, 324/649, 658, 665, 667, 676, 677, 678, 679, 324/681, 686; 331/111, 143, 150, 44, 46, 331/49
See application file for complete search history.

(56) References Cited

U.S. PATENT DOCUMENTS
6,456,096 B1 * 9/2002 Ericson et al. ............ 324/707
7,119,550 B2 * 10/2006 Kitano et al. ............. 324/658
7,307,485 B1 12/2007 Snyder et al.

OTHER PUBLICATIONS

Ylimaula, M., et al., Monolithic SOI-MEMS Capacitive Pressure Sensor with Standard Bulk CMOS Readout Circuit, Solid-State Circuits Conference, 2003. ESSCIRC '03. Sep. 16-18, 2003, pp. 611-614.
Repas, R., Sensor Sense: Capacitive Touch Sensors, Feb. 2, 2009, Retreived from internet: URL: http://machinedesign.com/article/sensor-sense-capacitive-touch-sensors-0202.

* cited by examiner

*Primary Examiner* — Ryan Johnson
(74) *Attorney, Agent, or Firm* — Ingrassia Fisher & Lorenz, P.C.

(57) ABSTRACT

Systems and methods are provided for determining the value of a capacitance. A system for sensing capacitance comprises an oscillator arrangement comprising a plurality of oscillators and a mismatch compensation arrangement coupled between the oscillator arrangement and a first capacitive element having a first capacitance. The mismatch compensation arrangement is configured to selectively couple the first capacitive element to a respective oscillator of the plurality of oscillators, wherein an oscillation frequency of the respective oscillator is influenced by the first capacitance.

20 Claims, 2 Drawing Sheets

CAPACITANCE SENSING WITH MISMATCH COMPENSATION

TECHNICAL FIELD

Embodiments of the subject matter described herein relate generally to capacitance sensing, and more particularly, embodiments of the subject matter relate to capacitance sensing systems that compensate for component mismatch and other component variations.

BACKGROUND

Capacitance sensing is utilized in a wide number of applications. In particular, many capacitive interfaces, such as touch pads, touch panels, or capacitive devices, such as capacitive accelerometers, force sensors, gauges, and the like, rely on the ability to accurately measure or sense an unknown capacitance (or a change thereof). Some prior art systems utilize a pair of relaxation oscillators to sense an unknown capacitance. However, parasitic capacitances and component variations (e.g., process, voltage, and temperature (PVT) variations, and the like) between the relaxation oscillators constrain the ability of these systems to accurately sense or measure the unknown capacitance, thereby limiting the utility of these systems over time, particularly in the case of relatively small capacitances (or relatively small changes thereof).

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
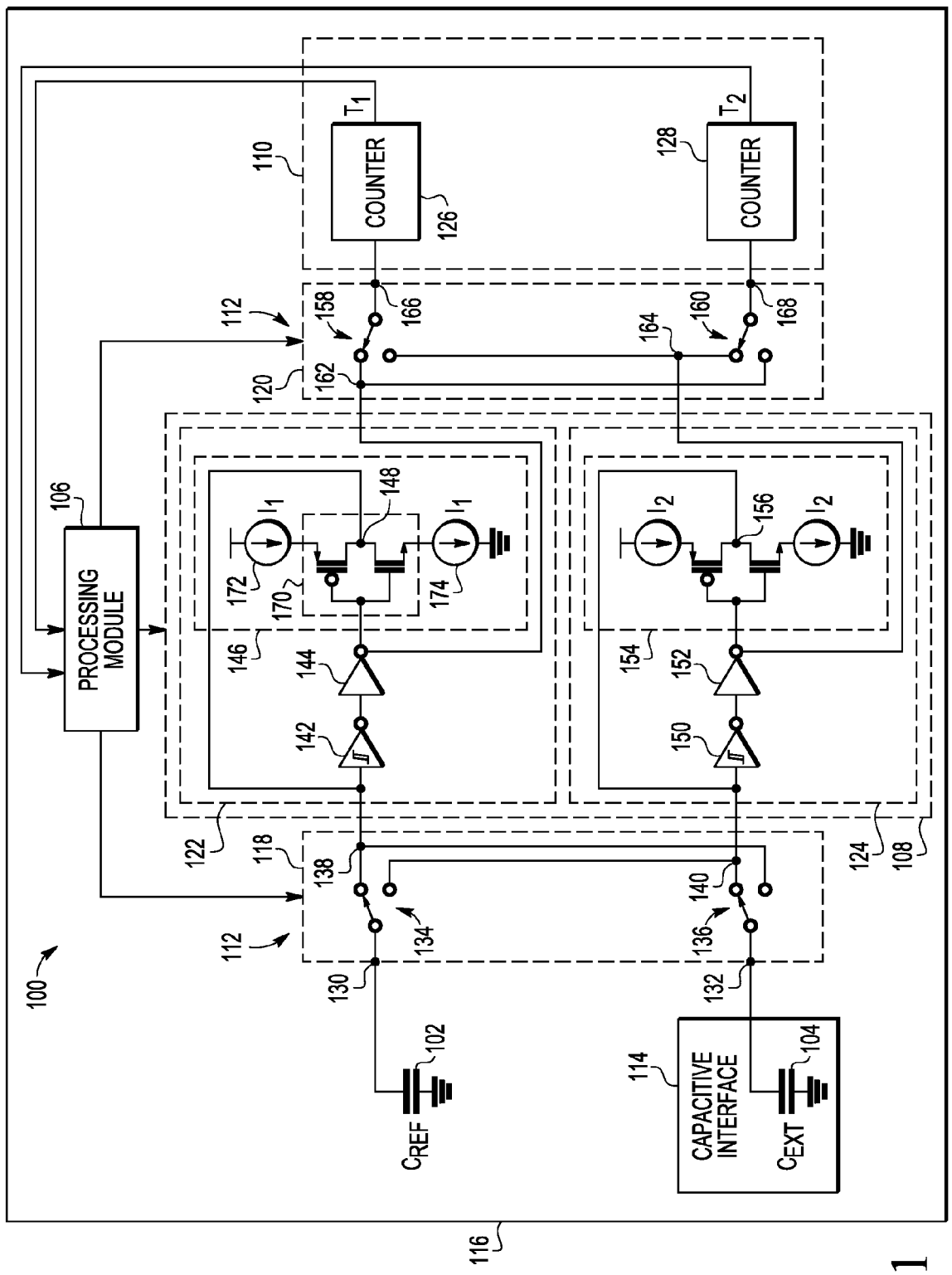
FIG. 1 is a schematic view of a capacitance sensing system in accordance with one embodiment of the invention.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

The following description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

For the sake of brevity, conventional techniques related to capacitive interfaces, relaxation oscillators, current sources, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used in the following description for the purpose of reference only, and thus are not intended to be limiting, and the terms "first", "second" and other such numerical terms referring to structures do not imply a sequence or order unless clearly indicated by the context.

Technologies and concepts discussed herein relate to capacitance sensing systems that compensate for manufacturing variations and/or other component variations (such as process, voltage, temperature (PVT) variations), parasitic capacitances, and other forms of mismatch between theoretically "matched" oscillators, that is, oscillators having substantially identical components (e.g., each component has substantially the same size and internal delay as its corresponding component in the other oscillator) and operating characteristics. However, it will be appreciated that, in practice, manufacturing variations and parasitic capacitances result in imperfect component matching, and due to design and/or cost constraints, in practical embodiments, the oscillator circuitry likely will not be perfectly matched. This mismatch between the oscillators causes the oscillators to oscillate with different frequencies in response to the same capacitance, and thus, introduces error into the capacitance measurement.

As described in greater detail below, a mismatch compensation arrangement is operated in a manner that compensates for mismatch between the oscillators that would otherwise limit the accuracy of the capacitance measurement. A number of oscillations attributable to the unknown capacitance is obtained from each oscillator of the pair of oscillators and a number of oscillations attributable to a reference capacitance is concurrently obtained from the other oscillator of the pair of oscillators. The value and/or magnitude of the unknown capacitance is determined based on the ratio of the number of oscillations attributable to the reference capacitance to the number of oscillations attributable to the unknown capacitance. By virtue of the mismatch compensation, the matching requirements of the oscillator circuitry are relaxed, thereby reducing the size and/or cost of the oscillator circuitry to achieve a desired accuracy.

FIG. 1 depicts an exemplary embodiment of a capacitance sensing system 100 suitable for use with an electronic device 116 having a capacitive interface 114. The capacitive interface 114 is configured to provide a capacitive element 104 under test, wherein the capacitive element has an unknown and/or variable capacitance ($C_{EXT}$). In an exemplary embodiment, the capacitance sensing system 100 includes, without limitation, a reference capacitive element 102 having a reference capacitance ($C_{REF}$), the under test capacitive element 104, a processing module 106, an oscillator arrangement 108, a counter arrangement 110, and a mismatch compensation arrangement 112. The elements of the capacitance sensing system 100 are suitably configured to sense or otherwise determine the capacitance ($C_{EXT}$) of the under test capacitive element 104, as described in greater detail below.

It should be understood that FIG. 1 is a simplified representation of a capacitance sensing system 100 for purposes of explanation and ease of description, and that practical embodiments may include other devices and components to provide additional functions and features, and/or the capacitance sensing system 100 may be part of a much larger electrical system, as will be understood. Additionally, although FIG. 1 depicts direct electrical connections between circuit elements and/or terminals, alternative embodiments may employ intervening circuit elements and/or components while functioning in a substantially similar manner.

In an exemplary embodiment, the mismatch compensation arrangement 112 comprises a pair of switching arrangements 118, 120 and the oscillator arrangement 108 comprises a pair of oscillators 122, 124. The first switching arrangement 118 is coupled between the capacitive elements 102, 104 and the oscillators 122, 124 of the oscillator arrangement 108 such that the first switching arrangement 118 selectively couples a respective capacitive element 102, 104 to a respective oscillator 122, 124 of the oscillator arrangement 108. As described in greater detail below, the first switching arrangement 118 and capacitive elements 102, 104 are configured such that the oscillation frequency of a respective oscillator 122, 124 is influenced by or otherwise dependent on the capacitance of the respective capacitive element 102, 104 it is coupled to. In an exemplary embodiment, the counter arrangement 110 comprises a pair of counters 126, 128, wherein the second switching arrangement 120 is coupled between the oscillator arrangement 108 and the counter arrangement 110 such that the oscillators 122, 124 are selectively coupled a respective counter 126, 128 of the counter arrangement 110. As described in greater detail below, in an exemplary embodiment, the switching arrangements 118, 120 operate in concert, such that the first counter 126 corresponds to a number of oscillations attributable to the reference capacitive element 102 and the second counter 128 corresponds to a number of oscillations attributable to the under test capacitive element 104. The processing module 106 is coupled to the oscillator arrangement 108, the counter arrangement 110, and the mismatch compensation arrangement 112, and the processing module 106 is configured to operate or otherwise control the switching arrangements 118, 120 in a manner that compensates for mismatch between the oscillators 122, 124, as described in greater detail below. It should be noted that although FIG. 1 depicts the counter arrangement 110 and processing module 106 as distinct and separate elements, in practical embodiments, the functionality and/or features of the counter arrangement 110 may be implemented by the processing module 106, and in such alternate embodiments, the counter arrangement 110 need not be present.

In an exemplary embodiment, the reference capacitive element 102 is realized as a capacitor having a capacitance of about 50 pF, although in other embodiments, the capacitance of the reference capacitive element 102 may range from about 0.5 pF to about 500 pF, or potentially other values, depending on the needs of a particular application. Depending on the embodiment, the value of the reference capacitance ($C_{REF}$) may be stored or otherwise maintained by the processing module 106, or alternatively, the value of the reference capacitance may be provided to the processing module 106 by a user. For convenience and ease of explanation, the reference capacitive element 102 may alternatively be referred to herein as the reference capacitor, however, in alternative embodiments, the reference capacitive element 102 may be realized as an integrated capacitor, a trimmed value capacitor, a native capacitor, or another arrangement of circuit elements capable of providing a reference capacitance. It will be appreciated that in various embodiments the reference capacitive element 102 may be implemented within an integrated circuit (or chip) that includes other elements of the capacitance sensing system 100 or external to an integrated circuit including other elements of the capacitance sensing system 100. As shown in FIG. 1, in an exemplary embodiment, the reference capacitor 102 is coupled between a ground reference node (e.g., the electrical ground for the capacitance sensing system 100) and a first node 130.

The under test capacitive element 104 generally represents an unknown and/or variable capacitance. For convenience and ease of explanation, the under test capacitive element 104 is alternatively referred to herein as an external capacitive element having an external capacitance, however, it should be appreciated that the external capacitive element 104 need not be physically external to the capacitance sensing system 100 and/or electronic device 116. As described in greater detail below, in an exemplary embodiment, the value and/or presence of the external capacitance ($C_{EXT}$) serves as a criterion for a particular action by the processing module 106 and/or electronic device 116. In accordance with one embodiment, the external capacitive element 104 is part of a capacitive interface 114 that is integral with the electronic device 116 and utilized to interact with the electronic device 116. For example, the capacitive interface 114 may be realized as a touch pad (or touch panel), wherein the magnitude of the external capacitance ($C_{EXT}$) is directly related to the proximity and/or presence of a conductive or semiconductive object, such as a finger, to the touch pad. Similarly, in other applications, the magnitude of the external capacitance is directly related to the proximity and/or presence of a liquid in a level gauge or electrodes in a force strain sensor. As shown in FIG. 1, in an exemplary embodiment, the capacitive interface 114 is configured such that the external capacitive element 104 is coupled between ground and a second node 132.

The processing module 106 generally represents the hardware, software, and/or firmware components of the capacitance sensing system 100 configured to control operation of the switching arrangements 118, 120 and oscillators 122, 124 and perform additional tasks and/or functions described in greater detail below. Depending on the embodiment, the processing module 106 may be implemented or realized with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. The processing module 106 may also be implemented as a combination of computing devices, e.g., a combination of a digital signal processor and a microprocessor, a plurality of microprocessors, one or more microprocessors in conjunction with a digital signal processor core, or any other such configuration. In practice, the processing module 106 includes processing logic that may be configured to carry out the functions, techniques, and processing tasks associated with the operation of the capacitance sensing system 100, as described in greater detail below. Furthermore, the steps of a method or algorithm described in connection with the embodiments disclosed herein may be embodied directly in hardware, in firmware, in a software module executed by the processing module 106, or in any practical combination thereof.

In an exemplary embodiment, the first switching arrangement 118 includes a first switching element 134 and a second switching element 136. The switching elements 134, 136 may be realized as transistor switches, such as, for example, transmission gates. The first switching element 134 is coupled between the reference capacitor 102 at node 130, the first oscillator 122 at node 138, and the second oscillator 124 at node 140, wherein depending on the state of the first switching element 134, the reference capacitor 102 is electrically connected to either the first oscillator 122 or the second oscillator 124 via the first switching element 134. Similarly, the second switching element 136 is coupled between the external capacitive element 104 at node 132, the first oscillator 122 at node 138, and the second oscillator 124 at node 140, wherein depending on the state of the second switching element 136, the external capacitive element 104 is electrically connected to either the first oscillator 122 or the second oscillator 124 via the second switching element 136. In an exemplary embodiment, the switching elements 134, 136 are operated in concert and configured such that one of the capacitive elements 102, 104 is coupled to the first oscillator 122, and concurrently, the other of the capacitive elements 102, 104 is coupled to the second oscillator 124.

In an exemplary embodiment, the oscillators 122, 124 are each realized as fixed current relaxation oscillators, that is, each oscillator 122, 124 is configured to charge/discharge a respective capacitive element 102, 104 coupled to it with a fixed charging current such that the oscillation frequency of the oscillator 122, 124 is based on or otherwise influenced by the capacitance at an input to the oscillator 122, 124, as described in greater detail below. In this regard, in the illustrated embodiment, the first oscillator 122 comprises a Schmitt trigger 142, an inverter 144, and a pull up/pull down current arrangement 146. The input of the Schmitt trigger 142 is coupled to node 138 and the output of the Schmitt trigger 142 is coupled to the input of the inverter 144, and the output of the inverter 144 is coupled to the pull up/pull down current arrangement 146. As shown in FIG. 1, the pull up/pull down current arrangement 146 comprises a CMOS inverter 170 having a first current source 172 coupled in series between a supply voltage and the CMOS inverter 170 and a second current source 174 coupled between the CMOS inverter 170 and the electrical ground for the capacitance sensing system 100. The output node 148 of the CMOS inverter 170 is coupled to node 138, such that the pull up/pull down current arrangement 146 is configured to provide either a charging current (via first current source 172) or a discharging current (via second current source 174) to the respective capacitive element 102, 104 is coupled to node 138. In an exemplary embodiment, the current sources 172, 174 are each configured to provide the same current. In accordance with one or more embodiments, the processing module 106 is coupled to the current sources 172, 174 and configured to set or otherwise control the amount of current ($I_1$) through the current sources 172, 174.

By virtue of the configuration shown in FIG. 1, the output of the inverter 144 is a square wave which changes or alternates its state in response to the voltage at node 138 reaching either the lower voltage threshold or the upper voltage threshold of the Schmitt trigger 142, as will be appreciated in the art. The square wave output of the inverter 144 also causes the pull up/pull down current arrangement 146 to alternate from charging the capacitance at node 138 (or "pulling up" the voltage at node 138 via the first current source 172) to discharging the capacitance at node 138 (or "pulling down" the voltage at node 138 via the second current source 174), and vice versa. The oscillation frequency of the output of the inverter 144 depends upon the time required to charge/discharge the capacitance at node 138 to either the upper voltage threshold or the lower voltage threshold of the Schmitt trigger 142. Thus, the oscillation period, that is, the time required for the square wave at the output of the inverter 144 to complete one logical high state (e.g., logical '1') and one logical low state (e.g., logical '0'), is directly related to the magnitude of the capacitance at node 138, wherein a higher oscillation period (or lower oscillation frequency) corresponds to a larger capacitance at node 138. In this manner, the number of oscillation periods (or number of oscillations) of the first oscillator 122 observed during a particular time interval is attributable to the value of the capacitance at node 138 (i.e., the respective capacitive element 102, 104 coupled to node 138) during the respective time interval.

Similarly, in an exemplary embodiment, the second oscillator 124 comprises a Schmitt trigger 150, an inverter 152, and a pull up/pull down current arrangement 154. The input of the Schmitt trigger 150 is coupled to node 140 and a node 156 of the pull up/pull down current arrangement 154 is also coupled to node 140, such that the pull up/pull down current arrangement 154 charges/discharges a capacitance at node 140 in a similar manner as pull up/pull down current arrangement 146. Thus, the number of oscillation periods (or number of oscillations) of the second oscillator 124 observed during a particular time interval is attributable to the value of the capacitance at node 140 (i.e., the respective capacitive element 102, 104 coupled to node 140) during the respective time interval.

In an exemplary embodiment, the oscillators 122, 124 are matched, that is, the pull up/pull down current arrangements 146, 154 have substantially identical currents (e.g., $I_1 \approx I_2$), the threshold voltages for Schmitt triggers 142, 150 are substantially the same, and each component of the second oscillator 124 has substantially the same size and internal delay as its corresponding component in the first oscillator 122. However, as noted above, in practice, manufacturing variances and/or PVT variations result in an imperfect component matching, and due to design and/or cost constraints, in practical embodiments, mismatch may exist between the oscillators 122, 124 which, in turn, introduces error into the capacitance measurement. As described in greater detail below, the mismatch compensation arrangement 112 is operated in a manner that compensates for mismatch (e.g., parasitic capacitances, PVT variations and/or other component variations) between the oscillators 122, 124 that would otherwise limit the accuracy of the capacitance measurement. By virtue of the mismatch compensation, the matching requirements for the oscillator circuitry are relaxed, thereby allowing the size and/or cost of the oscillators 122, 124 to be reduced for a desired level of accuracy.

In an exemplary embodiment, the second switching arrangement 120 includes a third switching element 158 and a fourth switching element 160. The switching elements 158, 160 may be implemented as transistor switches in a similar manner as described above in the context of switching elements 134, 136. The third switching element 158 is coupled to the output of the inverter 144 of the first oscillator 122 at node 162, the output of the inverter 152 of the second oscillator 124 at node 164, and the first counter 126 at node 166. Depending on the state of the third switching element 158, the first counter 126 is electrically connected to either the first oscillator 122 or the second oscillator 124 via the third switching element 158. Similarly, the fourth switching element 160 is coupled to the first oscillator 122 at node 162, the second oscillator 124 at node 164, and the second counter 128 at node 168, and configured such that depending on the state of the fourth switching element 160, the second counter 128 is electrically connected to either the first oscillator 122 or the second oscillator 124 via the fourth switching element 160. In an exemplary embodiment, the switching elements 158, 160 are operated in concert with the switching elements 134, 136 of the first switching arrangement 118 such that the reference capacitor 102 and the first counter 126 are concurrently coupled to the same oscillator 122, 124 of the oscillator arrangement 108 while the external capacitive element 104 and the second counter 128 are concurrently coupled to the other oscillator 122, 124 of the oscillator arrangement 108. In this regard, the first counter 126 maintains a count of the number of oscillations (or oscillation periods) ($T_1$) attributable to the reference capacitance (or reference capacitor 102) while the second counter 128 maintains a count of the number of oscillations ($T_2$) attributable to the external capacitance (or external capacitive element 104).

As set forth above, the oscillation period (or oscillation frequency) of an oscillator 122, 124 depends upon the capacitance at the input node 138, 140 of the respective oscillator 122, 124. Thus, the ratio of the number of oscillations attributable to the external capacitive element 104 to the number of oscillations attributable to the reference capacitor 102 during a particular time interval corresponds to the inverse of the ratio of the external capacitance ($C_{EXT}$) to the reference capacitance ($C_{REF}$). Accordingly, in an exemplary embodiment, the processing module 106 determines the value and/or magnitude of the external capacitance ($C_{EXT}$) based on the ratio of the number of oscillations ($T_1$) attributable to the reference capacitive element 102 to the number of oscillations ($T_2$) attributable to the external capacitive element 104, as described in greater detail below.

Figure 2:
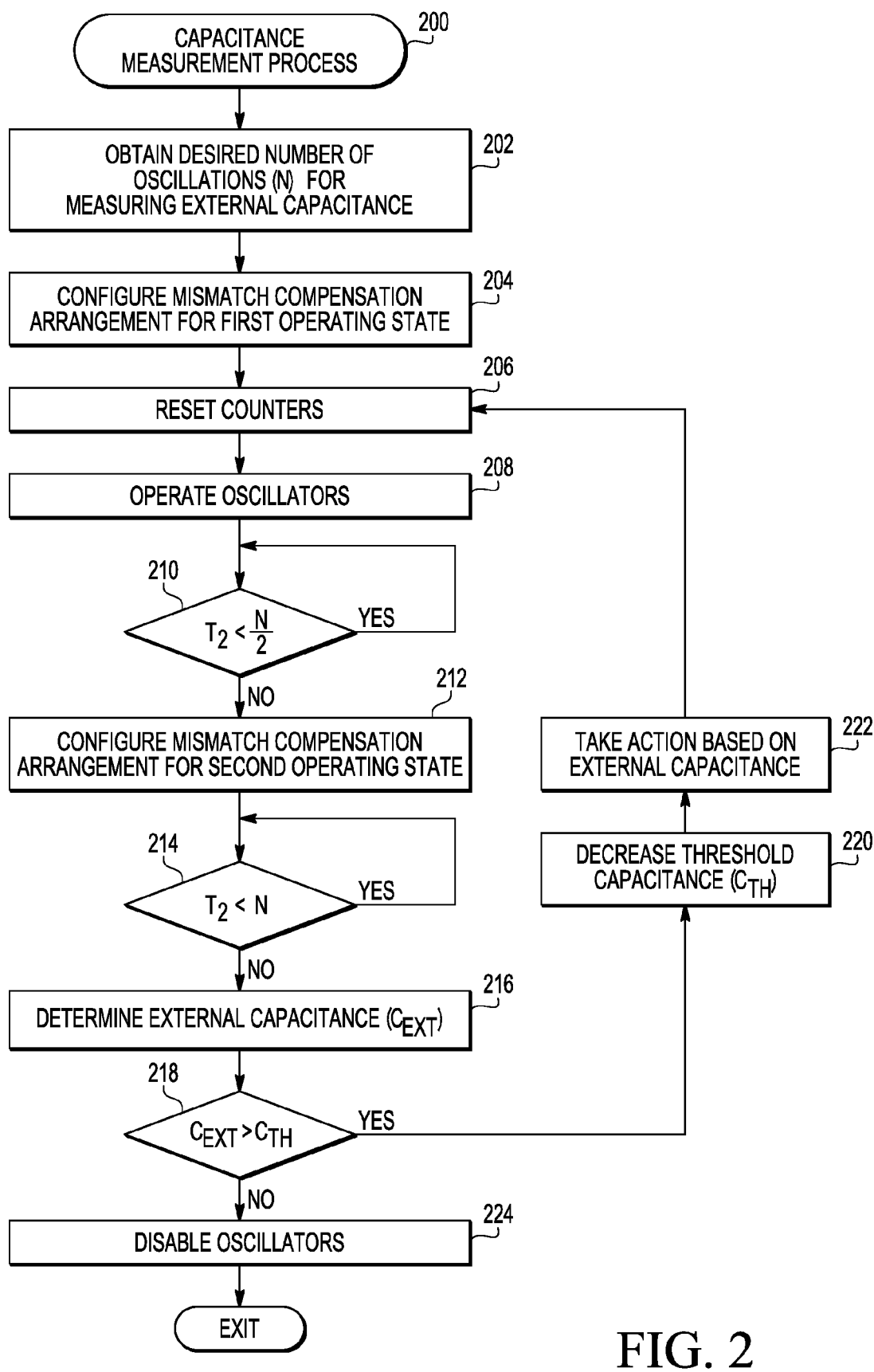
FIG. 2 is a flow diagram of a capacitance measurement process suitable for use with the capacitance sensing system of FIG. 1 in accordance with one embodiment of the invention.

Referring now to FIG. 2, in an exemplary embodiment, a capacitance sensing system is configured to perform a capacitance measurement process 200 and additional tasks, functions, and/or operations as described below. The various tasks may be performed by software, hardware, firmware, or any combination thereof. For illustrative purposes, the following description may refer to elements mentioned above in connection with FIG. 1 and FIG. 2. In practice, the tasks, functions, and operations may be performed by different elements of the described system, such as the processing module 106, oscillator arrangement 108, the counter arrangement 110 and/or the mismatch compensation arrangement 112. It should be appreciated any number of additional or alternative tasks may be included, and may be incorporated into a more comprehensive procedure or process having additional functionality not described in detail herein.

Referring now to FIG. 2, and with continued reference to FIG. 1, a capacitance measurement process 200 may be performed to sense or otherwise determine the value and/or magnitude of an unknown capacitance and respond to the capacitance in a manner that is influenced by the value and/or magnitude of the capacitance. In an exemplary embodiment, the capacitance measurement process 200 begins by determining or otherwise obtaining a desired number of oscillations corresponding to the unknown capacitive element which are to be counted for purposes of measuring the capacitance of the unknown capacitive element (task 202). In this regard, a larger number of oscillations (or oscillator periods) corresponds to a larger duration of time for counting oscillations of the oscillators 122, 124, which in turn reduces the impact of truncation errors on the counted number of oscillations ($T_1$) for the reference capacitive element and effectively averages the capacitance measurement over a larger amount of time. In an exemplary embodiment, the desired number of oscillations (N) attributable to the external capacitive element 104 is an even integer chosen such that the truncation error is less than about one percent. In this regard, to achieve a truncation error less than or equal to one percent, the number of oscillations attributable to the reference capacitive element 102 is greater than or equal to 100, such that the desired number of oscillations (N) may be determined by $$N \times \frac{C_{EXT}}{C_{REF}} \geq 100$$

using an expected or estimated capacitance value for the external capacitance ($C_{EXT}$). Thus, it will be appreciated that the desired number of oscillator periods (N) to achieve a desired truncation error level will vary depending on the reference capacitance ($C_{REF}$) and the anticipated capacitance of the external capacitive element 104 for a given application. For example, in accordance with one embodiment, the reference capacitance ($C_{REF}$) is about 50 pF, the anticipated capacitance of the external capacitive element 104 is about 200 pF, then the desired number of oscillator periods (N) is chosen to be greater than 25 to achieve a truncation error of less than one percent. In accordance with one embodiment, the processing module 106 stores or otherwise maintains the desired number of oscillations (N) in memory. It will be appreciated that in practical embodiments, the desired number of oscillations may be chosen based on different criteria for a particular application.

In an exemplary embodiment, the capacitance measurement process 200 continues by configuring the mismatch compensation arrangement for a first operating state (task 204). In this regard, the processing module 106 configures the switching elements 134, 136, 158, 160 such that the reference capacitor 102 and the first counter 126 are each coupled to the same oscillator 122, 124 of the oscillator arrangement 108 and the external capacitive element 104 and the second counter 128 are each coupled to the other oscillator 122, 124 of the oscillator arrangement 108. For example, in accordance with one embodiment, for the first operating state, the processing module 106 configures the first switching element 134 such that node 130 and node 138 are electrically connected and configures the third switching element 158 such that node 162 and node 166 are electrically connected. The processing module 106 configures the second switching element 136 such that node 132 and node 140 are electrically connected and configures the fourth switching element 160 such that node 164 and node 168 are electrically connected. Thus, in the first operating state, the reference capacitor 102 and the first counter 126 are each coupled to the first oscillator 122 and the external capacitive element 104 and the second counter 128 are each coupled to the second oscillator 124.

After configuring the mismatch compensation arrangement for the first operating state, the capacitance measurement process 200 continues by resetting the counters of the counting arrangement to zero and operating the oscillators of the oscillator arrangement (tasks 206, 208). In accordance with one embodiment, the oscillators 122, 124 may initially be configured in a powered off state, wherein the current sources of the pull up/pull down current arrangements 146, 154 are set to zero or otherwise turned off. After configuring the mismatch compensation arrangement 112 for the first operating state, the processing module 106 resets the counters 126, 128 to zero and enables or otherwise activates the pull up/pull down current arrangements 146, 154 by setting the charging/discharging currents through the pull up/pull down current arrangements 146, 154 to a nonzero value. As set forth above, in an exemplary embodiment, the current sources of the pull up/pull down current arrangements 146, 154 are configured such that the charging/discharging currents through the pull up/pull down current arrangements 146, 154 are substantially equal (e.g., $I_1=I_2$ within realistic and/or practical operating tolerances).

Once the current sources (or charging/discharging currents) of the pull up/pull down current arrangements 146, 154 are enabled, the oscillators 122, 124 begin oscillating in a conventional manner. While the mismatch compensation arrangement is configured for the first operating state, the oscillation frequency (and thus the period of oscillation) for the first oscillator 122 depends upon the reference capacitance ($C_{REF}$) and the oscillation frequency of the second oscillator 124 depends upon the external capacitance ($C_{EXT}$). Each time the output of a respective inverter 144, 152 changes from low to high (e.g., logical '0' to logical '1'), the respective counter 126, 128 coupled to the inverter 144, 152 increments by one, such that the value of the first counter 126 ($T_1$) corresponds to the number of oscillations of the first oscillator 122 attributable to the reference capacitance ($C_{REF}$) and the value of the second counter 128 ($T_2$) corresponds to the number of oscillations of the second oscillator 124 attributable to the external capacitance ($C_{EXT}$).

In an exemplary embodiment, the capacitance measurement process 200 obtains the number of oscillations attributable to the external capacitance ($C_{EXT}$) and determines whether the number of oscillations for the oscillator attributable to the external capacitance is less than one half the desired number of oscillations (N/2) (task 210). Once the number of oscillations attributable to the external capacitance is equal to (or greater than) one half the desired number of oscillations, the capacitance measurement process 200 continues by configuring the mismatch compensation arrangement for the second operating state (task 212). In this regard, the processing module 106 obtains the number of oscillations for the second oscillator 124 while the mismatch compensation arrangement 112 is in the first operating state and configures the mismatch compensation arrangement 112 for the second operating state when the number of oscillations ($T_2$) attributable to the external capacitance ($C_{EXT}$) is greater than or equal to N/2. In an exemplary embodiment, the processing module 106 configures the mismatch compensation arrangement 112 for the second operating state by switching or otherwise operating the switching elements 134, 136, 158, 160 in concert. As a result, the switching elements 134, 136, 158, 160 change their state in a substantially simultaneous manner.

In an exemplary embodiment, for the second operating state, the processing module 106 configures the first switching element 134 such that node 130 and node 140 are electrically connected and configures the third switching element 158 such that node 164 and node 166 are electrically connected. The processing module 106 configures the second switching element 136 such that node 132 and node 138 are electrically connected and configures the fourth switching element 160 such that node 162 and node 168 are electrically connected. Thus, in the second operating state, the reference capacitor 102 and the first counter 126 are each coupled to the second oscillator 124 and the external capacitive element 104 and the second counter 128 are each coupled to the first oscillator 122, wherein the oscillation frequency of the first oscillator 122 depends upon the external capacitance ($C_{EXT}$) and the oscillation frequency of the second oscillator 124 depends upon the reference capacitance ($C_{REF}$). Thus, the value of the first counter 126 ($T_1$) represents the sum of the number of oscillations of the first oscillator 122 while the mismatch compensation arrangement 112 is in the first operating state and the number of oscillations of the second oscillator 124 while the mismatch compensation arrangement 112 is in the second state, such that the value ($T_1$) of the first counter 126 corresponds to a total number of oscillations attributable to the reference capacitance ($C_{REF}$). Similarly, the value of the second counter 128 ($T_2$) represents the sum of the number of oscillations of the second oscillator 124 while the mismatch compensation arrangement 112 is in the first operating state and the number of oscillations of the first oscillator 122 while the mismatch compensation arrangement 112 is in the second operating state, such that the value ($T_2$) of the second counter 128 corresponds to the total number of oscillations attributable to the external capacitance ($C_{EXT}$).

In an exemplary embodiment, once the total number of oscillations attributable to the external capacitance ($C_{EXT}$) equals the desired number of oscillations (i.e., $T_2=N$), the capacitance measurement process 200 continues by determining the value of the external capacitance based upon the ratio of the number of oscillations attributable to the reference capacitance to the number of oscillations attributable to the external capacitance (tasks 214, 216). In an exemplary embodiment, the processing module 106 determines the value and/or magnitude of the external capacitance by multiplying the ratio of the number of oscillations attributable to the reference capacitance to the number of oscillations attributable to the external capacitance by the value of the reference capacitance $$\left(C_{EXT} = \frac{T_1}{T_2} \times C_{REF}\right).$$

In alternative embodiments, in lieu of calculating and/or determining the actual value of the external capacitance ($C_{EXT}$), the capacitance sensing system 100 may be implemented ratiometrically, wherein the capacitance sensing system 100 and/or processing module 106 utilizes the ratio of the number of oscillations attributable to the reference capacitance to the number of oscillations attributable to the external capacitance as being equivalent to the value of the external capacitance and treats the reference capacitance as being equivalent to a value of one $$\left(\text{e.g., } C_{EXT} \approx \frac{T_1}{T_2} \text{ and } C_{REF} \approx 1\right).$$

By virtue of the mismatch compensation arrangement 112, the total number of oscillations attributable to the external capacitance ($C_{EXT}$) is obtained using the second oscillator 124 for a first interval (e.g., while $T_2 \leq N/2$) and the first oscillator 122 for a second interval (e.g., while $N/2 < T_2 \leq N$). Because the oscillators 122, 124 are matched, the duration of the first interval and second interval are substantially equal in duration (without taking into account different delays and/or component variations of between the oscillators 122, 124). Thus, the total number of oscillations attributable to the reference capacitance ($C_{REF}$) is obtained using the each oscillator 122, 124 for the substantially same amount of time as the oscillator 122, 124 was used for obtaining the number of oscillations attributable to the external capacitance ($C_{EXT}$). As a result, the total number of oscillations ($T_1$) attributable to the reference capacitance ($C_{REF}$) and the total number of oscillations attributable to the external capacitance ($C_{EXT}$) are equally affected by the delays and/or component variations of each oscillator 122, 124. In other words, the total number of oscillations ($T_2$) attributable to the external capacitance ($C_{EXT}$) and the total number of oscillations ($T_1$) attributable to the reference capacitance ($C_{REF}$) each reflect parasitic capacitances, PVT variations and/or other internal delays of both oscillators 122, 124 in a corresponding manner. As a result, the ratio of the number of oscillations attributable to the reference capacitance ($C_{REF}$) to the number of oscillations attributable to the external capacitance ($C_{EXT}$) effectively cancels out the effect of any mismatch between oscillators 122, 124. For example, if there is current mismatch between oscillators 122, 124, the initial mismatch error is governed by $\Delta/I$ where $\Delta$ is the amount of error and $I$ is the intended value of current through the current arrangements 146, 154, then the mismatch error after performing the mismatch compensation described above is governed by $2\Delta^2/I^2$. Thus, if the initial mismatch error is about 10%, then the mismatch error after compensation is about 2%, roughly a fivefold improvement. It will be appreciated as the initial mismatch error decreases, then the mismatch error after compensation reduces exponentially, such that an initial mismatch error of about 1% results in a mismatch error of about 0.02% (or roughly a fiftyfold improvement). Thus, the mismatch compensation arrangement described herein allows the manufacturing and/or matching requirements for the oscillators 122, 124 to be relaxed while still achieving a desired error level, allowing the oscillators 122, 124 to be implemented with reduced size and/or cost.

In an exemplary embodiment, after determining the value and/or magnitude of the external capacitance ($C_{EXT}$), the capacitance measurement process 200 continues by determining whether the external capacitance is greater than threshold capacitance ($C_{TH}$) (task 218). The threshold capacitance is ($C_{TH}$) are preferably chosen to represent a non-negligible capacitance, such that the value and/or magnitude of the external capacitance ($C_{EXT}$) may be utilized as a decision-making criterion. For example, if the capacitive interface 114 is realized as a touch pad, the threshold capacitance ($C_{TH}$) is preferably chosen such that an external capacitance ($C_{EXT}$) greater than the upper threshold capacitance has a sufficiently high probability of being attributable to a touching of the touch pad (e.g., by a human finger or another conductive object) rather than a spurious event. In an exemplary embodiment, the value and/or magnitude of the external capacitance is greater than the threshold capacitance (e.g., $C_{EXT} > C_{TH}$), the capacitance measurement process 200 continues by decreasing the value of the threshold capacitance ($C_{TH}$) and taking action based on the external capacitance (tasks 220, 222). In this regard, in a touch pad application, the threshold capacitance is decreased to a value such that an external capacitance ($C_{EXT}$) less than the reduced threshold capacitance has a sufficiently high probability of being attributable to an absence of contact with the touch pad (e.g., a finger lifting off the touch pad) rather than a spurious event. The processing module 106 and/or capacitance sensing system 100 may activate the electronic device 116 (or particular features and/or components of the electronic device 116) when the capacitance of the capacitive interface 114 exceeds the threshold capacitance. The loop defined by tasks 206, 208, 210, 212, 214, 216, 218, 220 and 222 may repeat throughout operation to measure the external capacitance as needed or desired for a particular application. In an exemplary embodiment, the loop defined by tasks 206, 208, 210, 212, 214, 216, 218, 220 and 222 repeats throughout operation to measure the external capacitance as needed or desired for a particular application. It should be appreciated that other embodiments may utilize any number of threshold capacitances and/or utilize the capacitance measurement process 200 or capacitance sensing system 100 for different purposes, for example, to detect environmental changes or perform myriad different functions depending on the value of the external capacitance.

In an exemplary embodiment, when the external capacitance is less than the threshold capacitance (e.g., $C_{EXT} < C_{TH}$), the capacitance measurement process 200 disables the oscillators of the oscillator arrangement (task 224). In this regard, the processing module 106 may set the current sources of the pull up/pull down current arrangements 146, 154 to zero to conserve power. In addition, the capacitance measurement process 200 may deactivate the electronic device 116 (or features thereof) when the external capacitance is less than the threshold capacitance. For example, as described above, the threshold capacitance may be chosen such that an external capacitance below the threshold value indicates that the capacitive interface 114 and/or electronic device 116 is not in use, in which case, the processing module 106 may cause some components and/or features of the electronic device 116 to be powered off. In this regard, the capacitance sensing system 100 and/or processing module 106 may be configured for a low power mode, wherein the processing module 106 periodically polls the capacitive interface 114 by periodically operating the mismatch compensation arrangement 112 and oscillators 122, 124 to determine the magnitude of the external capacitance (e.g., tasks 204, 206, 208, 210, 212, 214, 216 and 218). While the external capacitance is less than the threshold capacitance, the processing module 106 may disable or otherwise power off the oscillators 122, 124 and wait for some specified duration before polling the capacitive interface 114 again (e.g., tasks 204, 206, 208, 210, 212, 214, 216, 218 and 224). When the external capacitance exceeds the threshold capacitance, the processing module 106 may activate components and/or features of the electronic device 116 and repeat the loop defined by tasks 206, 208, 210, 212, 214, 216, 218, 220 and 222 as needed or desired for a particular application.

One advantage of the systems described above is that mismatch and/or component variations between oscillators are effectively cancelled out, such that an unknown capacitance can be sense and/or measured accurately and reliably. The mismatch compensation arrangement and/or capacitance measurement process described herein may be utilized to reduce mismatch error to a negligibly small amount. As a result, the matching requirements of the oscillators may be relaxed, allowing smaller and/or cheaper oscillators to be used without compromising the accuracy and/or reliability of the capacitance sensing system.

Systems, devices, and methods configured in accordance with example embodiments of the invention relate to:

In accordance with one embodiment, a system for sensing capacitance is provided. The system comprises an oscillator arrangement comprising a plurality of oscillators and a mismatch compensation arrangement coupled between the oscillator arrangement and a first capacitive element having a first capacitance. The mismatch compensation arrangement is configured to selectively couple the first capacitive element to a respective oscillator of the plurality of oscillators, wherein an oscillation frequency of the respective oscillator is influenced by the first capacitance. In accordance with one embodiment, the system further comprises a processing module coupled to the oscillator arrangement, wherein the processing module is configured to obtain a first number of oscillations of a first oscillator of the oscillator arrangement during a first interval, obtain a second number of oscillations of a second oscillator of the oscillator arrangement after the first interval, and determine the first capacitance based on the first number of oscillations and the second number of oscillations. The first oscillator is coupled to the first capacitive element during the first interval such that the first number of oscillations is attributable to the first capacitance and the second oscillator is coupled to the first capacitive element after the first interval such that the second number of oscillations is also attributable to the first capacitance. In one embodiment, the system further comprises a reference capacitive element having a reference capacitance. The mismatch compensation arrangement is coupled between the reference capacitive element and the oscillator arrangement, wherein the mismatch compensation arrangement and the processing module are cooperatively configured to couple the reference capacitive element to the second oscillator during the first interval, such that the oscillation frequency of the second oscillator is influenced by the reference capacitance, and couple the reference capacitive element to the first oscillator after the first interval, such that the oscillation frequency of the first oscillator is influenced by the reference capacitance. In another embodiment, the processing module is configured to obtain a third number of oscillations of the second oscillator during the first interval, obtain a fourth number of oscillations of the first oscillator after the first interval, and determine the first capacitance based on a ratio of a sum of the third number of oscillations and the fourth number of oscillations to a sum of the first number of oscillations and the second number of oscillations.

In accordance with another embodiment, the mismatch compensation arrangement further comprises a first node coupled to the first capacitive element, a second node coupled to a first oscillator of the oscillator arrangement, a third node coupled to a second oscillator of the oscillator arrangement, and a first switching element coupled to the first node, the second node, and the third node. When the mismatch compensation arrangement is in a first operating state, the first node and the second node are electrically connected via the first switching element, such that the first capacitance influences the oscillation frequency of the first oscillator. When the mismatch compensation arrangement is in a second operating state, the first node and the third node are electrically connected via the first switching element, such that the first capacitance influences the oscillation frequency of the second oscillator. In a further embodiment, the system further comprises a reference capacitive element having a reference capacitance, wherein the mismatch compensation arrangement further comprises a fourth node coupled to the reference capacitive element and a second switching element coupled to the fourth node, the second node, and the third node. When the mismatch compensation arrangement is in the first operating state, the fourth node and the third node are electrically connected via the second switching element, such that the reference capacitance influences the oscillation frequency of the second oscillator. When the mismatch compensation arrangement is in the second operating state, the fourth node and the second node are electrically connected via the second switching element, such that the reference capacitance influences the oscillation frequency of the first oscillator. In yet a further embodiment, the system further comprises a processing module coupled to the oscillator arrangement and the mismatch compensation arrangement, wherein the processing module is configured to configure the mismatch compensation arrangement for the first operating state, obtain a first number of oscillations of the first oscillator while the mismatch compensation arrangement is configured for the first operating state, obtain a second number of oscillations of the second oscillator while the mismatch compensation arrangement is configured for the first operating state, configure the mismatch compensation arrangement for the second operating state, obtain a third number of oscillations of the first oscillator while the mismatch compensation arrangement is configured for the second operating state, obtain a fourth number of oscillations of the second oscillator while the mismatch compensation arrangement is configured for the second operating state, and determine the first capacitance based on a ratio of a sum of the first number of oscillations and the fourth number of oscillations to a sum of the second number of oscillations and the third number of oscillations. In yet another embodiment, the processing module is configured to operate the first switching element and the second switching element in concert.

In accordance with another embodiment, the system further comprises a first counter and a second counter, wherein the mismatch compensation arrangement further comprises a fifth node coupled to the first oscillator, a sixth node coupled to the second oscillator, seventh node coupled to the first counter, eighth node coupled to the second counter, a third switching element coupled to the fifth node, the sixth node, and the seventh node, and a fourth switching element coupled to the fifth node, the sixth node, and the eighth node. When the mismatch compensation arrangement is in the first operating state the fifth node and the seventh node are electrically connected via the third switching element, such that the first counter counts a number of oscillations of the first oscillator attributable to the first capacitance, and the sixth node and the eighth node are electrically connected via the fourth switching element, such that the second counter counts a number of oscillations of the second oscillator attributable to the reference capacitance. When the mismatch compensation arrangement is in the second operating state, the sixth node and the seventh node are electrically connected via the third switching element, such that the first counter counts a number of oscillations of the second oscillator attributable to the first capacitance, and the fifth node and the eighth node are electrically connected via the fourth switching element, such that the second counter counts a number of oscillations of the first oscillator attributable to the reference capacitance. In another embodiment, the system further comprises a counter coupled to the oscillator arrangement and a processing module coupled to the counter. The counter is configured to count a number of oscillations of the respective oscillator of the plurality of oscillators coupled to the first capacitive element and the processing module is configured to determine the first capacitance based on the number of oscillations.

In accordance with another embodiment, a method is provided for determining capacitance of a capacitive element having a first capacitance. The method comprises obtaining a number of oscillations attributable to the first capacitance from a first oscillator and a second oscillator, obtaining a number of oscillations attributable to a reference capacitance from the first oscillator and the second oscillator, and determining the first capacitance based on a ratio of the number of oscillations attributable to the first capacitance to the number of oscillations attributable to the reference capacitance. In accordance with one embodiment, obtaining the number of oscillations attributable to the first capacitance comprises obtaining a first number of oscillations of the first oscillator during a first interval, the capacitive element being coupled to the first oscillator during the first interval, and obtaining a second number of oscillations of the second oscillator after the first interval, the capacitive element being coupled to the second oscillator after the first interval. Obtaining the number of oscillations attributable to the reference capacitance comprises obtaining a third number of oscillations of the second oscillator during the first interval, the reference capacitance being coupled to the second oscillator during the first interval, and obtaining a fourth number of oscillations of the first oscillator after the first interval, the reference capacitance being coupled to the first oscillator after the first interval. In this embodiment, determining the first capacitance comprises determining the first capacitance based on a ratio of a sum of the first number of oscillations and the second number of oscillations to a sum of the third number of oscillations and the fourth number of oscillations. In another embodiment, the method further comprises configuring a switching arrangement for a first operating state during the first interval and configuring the switching arrangement for a second operating state after the first interval. When the switching arrangement is in the first operating state, the capacitive element is coupled to the first oscillator via the switching arrangement such that the oscillation frequency of the first oscillator is influenced by the first capacitance and the reference capacitance is coupled to the second oscillator via the switching arrangement such that the oscillation frequency of the second oscillator is influenced by the reference capacitance. When the switching arrangement is in the second operating state, the capacitive element is coupled to the second oscillator via the switching arrangement such that the oscillation frequency of the second oscillator is influenced by the first capacitance and the reference capacitance is coupled to the first oscillator via the switching arrangement such that the oscillation frequency of the first oscillator is influenced by the reference capacitance. In a further embodiment, the method further comprises obtaining a desired number of oscillations corresponding to the capacitive element, configuring the switching arrangement for the second operating state when the first number of oscillations is greater than or equal to one half the desired number of oscillations, and determining the first capacitance of the capacitive element when the sum of the first number of oscillations and the second number of oscillations is at least equal to the desired number of oscillations. In another embodiment, the switching arrangement comprises a first switching element coupled to the capacitive element and a second switching element coupled to the reference capacitance, wherein configuring the switching arrangement for the second operating state comprises switching the first switching element and the second switching element in concert, such that the second oscillator is electrically connected to the capacitive element via the first switching element and the first oscillator is electrically connected to the reference capacitance via the second switching element. In accordance with one embodiment, the method further comprises activating an electronic device having a capacitive interface including the capacitive element when the first capacitance of the capacitive element is greater than a threshold value. In another embodiment, determining the first capacitance comprises multiplying the ratio of the number of oscillations attributable to the reference capacitance to the number of oscillations attributable to the first capacitance by the reference capacitance.

In yet another embodiment, an apparatus is provided for an electronic device. The electronic device comprises a capacitive interface having a first capacitance, a reference capacitive element having a reference capacitance, an oscillator arrangement comprising a first oscillator and a second oscillator, and a switching arrangement coupled between the capacitive interface and the oscillator arrangement and between the reference capacitive element and the oscillator arrangement. For a first operating state of the switching arrangement, the capacitive interface is coupled to the first oscillator such that the oscillation frequency of the first oscillator is influenced by the first capacitance and the reference capacitive element is coupled to the second oscillator such that the oscillation frequency of the second oscillator is influenced by the reference capacitance. For a second operating state of the switching arrangement, the capacitive interface is coupled to the second oscillator such that the oscillation frequency of the second oscillator is influenced by the first capacitance and the reference capacitive element is coupled to the first oscillator such that the oscillation frequency of the first oscillator is influenced by the reference capacitance. In one embodiment, the electronic device further comprises a processing module coupled to the switching arrangement and the oscillator arrangement, wherein the processing module is configured to configure the switching arrangement for the first operating state, obtain a first number of oscillations of the first oscillator while the switching arrangement is configured for the first operating state, obtain a second number of oscillations of the second oscillator while the switching arrangement is configured for the first operating state, configure the switching arrangement for the second operating state, obtain a third number of oscillations of the first oscillator while the switching arrangement is configured for the second operating state, obtain a fourth number of oscillations of the second oscillator while the switching arrangement is configured for the second operating state, and determine the first capacitance based on a ratio of a sum of the second number of oscillations and the third number of oscillations to a sum of the first number of oscillations and the fourth number of oscillations. In a further embodiment, the switching arrangement further comprises a first switching element coupled between the capacitive interface and the oscillator arrangement and a second switching element coupled between the reference capacitive element and the oscillator arrangement, wherein the processing module is configured to operate the first switching element and the second switching element in concert.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A system for sensing capacitance of a first capacitive element having a first capacitance, the system comprising:
   an oscillator arrangement comprising a plurality of oscillators; and
   a mismatch compensation arrangement coupled between the first capacitive element and the oscillator arrangement, the mismatch compensation arrangement being configured to selectively couple the first capacitive element to a respective oscillator of the plurality of oscillators, wherein an oscillation frequency of the respective oscillator is influenced by the first capacitance.

2. The system of claim 1, further comprising a processing module coupled to the oscillator arrangement, wherein the processing module is configured to:
    obtain a first number of oscillations of a first oscillator of the oscillator arrangement during a first interval, wherein the first oscillator is coupled to the first capacitive element during the first interval such that the first number of oscillations is attributable to the first capacitance;
    obtain a second number of oscillations of a second oscillator of the oscillator arrangement after the first interval, wherein the second oscillator is coupled to the first capacitive element after the first interval such that the second number of oscillations is attributable to the first capacitance; and
    determine the first capacitance based on the first number of oscillations and the second number of oscillations.

3. The system of claim 2, further comprising a reference capacitive element having a reference capacitance, the mismatch compensation arrangement being coupled between the reference capacitive element and the oscillator arrangement, wherein the mismatch compensation arrangement and the processing module are cooperatively configured to:
    couple the reference capacitive element to the second oscillator during the first interval such that the oscillation frequency of the second oscillator is influenced by the reference capacitance; and
    couple the reference capacitive element to the first oscillator after the first interval such that the oscillation frequency of the first oscillator is influenced by the reference capacitance.

4. The system of claim 2, further comprising a reference capacitive element having a reference capacitance, wherein the processing module is configured to:
    obtain a third number of oscillations of the second oscillator during the first interval, the reference capacitive element being coupled to the second oscillator during the first interval;
    obtain a fourth number of oscillations of the first oscillator after the first interval, the reference capacitive element being coupled to the first oscillator after the first interval; and
    determine the first capacitance based on a ratio of a sum of the third number of oscillations and the fourth number of oscillations to a sum of the first number of oscillations and the second number of oscillations.

5. The system of claim 1, wherein the mismatch compensation arrangement further comprises:
    a first node coupled to the first capacitive element;
    a second node coupled to a first oscillator of the oscillator arrangement;
    a third node coupled to a second oscillator of the oscillator arrangement; and
    a first switching element coupled to the first node, the second node, and the third node, wherein:
        when the mismatch compensation arrangement is in a first operating state, the first node and the second node are electrically connected via the first switching element, such that the first capacitance influences the oscillation frequency of the first oscillator; and
        when the mismatch compensation arrangement is in a second operating state, the first node and the third node are electrically connected via the first switching element, such that the first capacitance influences the oscillation frequency of the second oscillator.

6. The system of claim 5, further comprising a reference capacitive element having a reference capacitance, wherein the mismatch compensation arrangement further comprises:
    a fourth node coupled to the reference capacitive element; and
    a second switching element coupled to the fourth node, the second node, and the third node, wherein:
        when the mismatch compensation arrangement is in the first operating state, the fourth node and the third node are electrically connected via the second switching element, such that the reference capacitance influences the oscillation frequency of the second oscillator; and
        when the mismatch compensation arrangement is in the second operating state, the fourth node and the second node are electrically connected via the second switching element, such that the reference capacitance influences the oscillation frequency of the first oscillator.

7. The system of claim 6, further comprising a processing module coupled to the oscillator arrangement and the mismatch compensation arrangement, wherein the processing module is configured to:
    configure the mismatch compensation arrangement for the first operating state;
    obtain a first number of oscillations of the first oscillator while the mismatch compensation arrangement is configured for the first operating state;
    obtain a second number of oscillations of the second oscillator while the mismatch compensation arrangement is configured for the first operating state;
    configure the mismatch compensation arrangement for the second operating state;
    obtain a third number of oscillations of the first oscillator while the mismatch compensation arrangement is configured for the second operating state;
    obtain a fourth number of oscillations of the second oscillator while the mismatch compensation arrangement is configured for the second operating state; and
    determine the first capacitance based on a ratio of a sum of the second number of oscillations and the third number of oscillations to a sum of the first number of oscillations and the fourth number of oscillations.

8. The system of claim 7, wherein the processing module is configured to operate the first switching element and the second switching element in concert.

9. The system of claim 6, further comprising a first counter and a second counter, wherein the mismatch compensation arrangement further comprises:
    a fifth node coupled to the first oscillator;
    a sixth node coupled to the second oscillator;
    a seventh node coupled to the first counter;
    an eighth node coupled to the second counter;
    a third switching element coupled to the fifth node, the sixth node, and the seventh node; and
    a fourth switching element coupled to the fifth node, the sixth node, and the eighth node, wherein:
        when the mismatch compensation arrangement is in the first operating state:
            the fifth node and the seventh node are electrically connected via the third switching element, such that the first counter counts a number of oscillations of the first oscillator attributable to the first capacitance; and
            the sixth node and the eighth node are electrically connected via the fourth switching element, such that the second counter counts a number of oscillations of the second oscillator attributable to the reference capacitance; and when the mismatch compensation arrangement is in the second operating state:

the sixth node and the seventh node are electrically connected via the third switching element, such that the first counter counts a number of oscillations of the second oscillator attributable to the first capacitance; and the fifth node and the eighth node are electrically connected via the fourth switching element, such that the second counter counts a number of oscillations of the first oscillator attributable to the reference capacitance.

10. The system of claim 1, further comprising:

a counter coupled to the oscillator arrangement, the counter being configured to count a number of oscillations of the respective oscillator of the plurality of oscillators coupled to the first capacitive element; and a processing module coupled to the counter, the processing module being configured to determine the first capacitance based on the number of oscillations.

11. A method for determining capacitance of a capacitive element having a first capacitance, the method comprising:

obtaining a number of oscillations attributable to the first capacitance from a first oscillator and a second oscillator;

obtaining a number of oscillations attributable to a reference capacitance from the first oscillator and the second oscillator; and determining the first capacitance based on a ratio of the number of oscillations attributable to the reference capacitance to the number of oscillations attributable to the first capacitance.

12. The method of claim 11, wherein:

obtaining the number of oscillations attributable to the first capacitance comprises:

obtaining a first number of oscillations of the first oscillator during a first interval, the capacitive element being coupled to the first oscillator during the first interval; and obtaining a second number of oscillations of the second oscillator after the first interval, the capacitive element being coupled to the second oscillator after the first interval;

obtaining the number of oscillations attributable to the reference capacitance comprises:

obtaining a third number of oscillations of the second oscillator during the first interval, the reference capacitance being coupled to the second oscillator during the first interval; and obtaining a fourth number of oscillations of the first oscillator after the first interval, the reference capacitance being coupled to the first oscillator after the first interval; and determining the first capacitance comprises determining the first capacitance based on a ratio of a sum of the third number of oscillations and the fourth number of oscillations to a sum of the first number of oscillations and the second number of oscillations.

13. The method of claim 11, further comprising:

configuring a switching arrangement for a first operating state during a first interval, wherein when the switching arrangement is in the first operating state:

the capacitive element is coupled to the first oscillator via the switching arrangement such that the oscillation frequency of the first oscillator is influenced by the first capacitance; and the reference capacitance is coupled to the second oscillator via the switching arrangement such that the oscillation frequency of the second oscillator is influenced by the reference capacitance; and configuring the switching arrangement for a second operating state after the first interval, wherein when the switching arrangement is in the second operating state:

the capacitive element is coupled to the second oscillator via the switching arrangement such that the oscillation frequency of the second oscillator is influenced by the first capacitance; and the reference capacitance is coupled to the first oscillator via the switching arrangement such that the oscillation frequency of the first oscillator is influenced by the reference capacitance.

14. The method of claim 13, further comprising obtaining a desired number of oscillations corresponding to the capacitive element, wherein:

configuring the switching arrangement for the second operating state after the first interval comprises configuring the switching arrangement for the second operating state when a first number of oscillations of the first oscillator is greater than or equal to one half the desired number of oscillations; and determining the first capacitance comprises determining the first capacitance of the capacitive element when the sum of the first number of oscillations and a second number of oscillations of the second oscillator is at least equal to the desired number of oscillations.

15. The method of claim 14, the switching arrangement comprising a first switching element coupled to the capacitive element and a second switching element coupled to the reference capacitance, wherein configuring the switching arrangement for the second operating state comprises switching the first switching element and the second switching element in concert, such that the second oscillator is electrically connected to the capacitive element via the first switching element and the first oscillator is electrically connected to the reference capacitance via the second switching element.

16. The method of claim 11, further comprising activating an electronic device having a capacitive interface including the capacitive element when the first capacitance of the capacitive element is greater than a threshold value.

17. The method of claim 11, wherein determining the first capacitance comprises multiplying the ratio of the number of oscillations attributable to the reference capacitance to the number of oscillations attributable to the first capacitance by the reference capacitance.

18. An electronic device comprising:

a capacitive interface having a first capacitance;

a reference capacitive element having a reference capacitance;

an oscillator arrangement comprising a first oscillator and a second oscillator; and a switching arrangement coupled between the capacitive interface and the oscillator arrangement and between the reference capacitive element and the oscillator arrangement, wherein:

for a first operating state of the switching arrangement:

the capacitive interface is coupled to the first oscillator such that the oscillation frequency of the first oscillator is influenced by the first capacitance; and the reference capacitive element is coupled to the second oscillator such that the oscillation frequency of the second oscillator is influenced by the reference capacitance; and for a second operating state of the switching arrangement:

the capacitive interface is coupled to the second oscillator such that the oscillation frequency of the second oscillator is influenced by the first capacitance; and the reference capacitive element is coupled to the first oscillator such that the oscillation frequency of the first oscillator is influenced by the reference capacitance.

19. The electronic device of claim 18, further comprising a processing module coupled to the switching arrangement and the oscillator arrangement, wherein the processing module is configured to:

configure the switching arrangement for the first operating state;

obtain a first number of oscillations of the first oscillator while the switching arrangement is configured for the first operating state;

obtain a second number of oscillations of the second oscillator while the switching arrangement is configured for the first operating state;

configure the switching arrangement for the second operating state;

obtain a third number of oscillations of the first oscillator while the switching arrangement is configured for the second operating state;

obtain a fourth number of oscillations of the second oscillator while the switching arrangement is configured for the second operating state; and determine the first capacitance based on a ratio of a sum of the second number of oscillations and the third number of oscillations to a sum of the first number of oscillations and the fourth number of oscillations.

20. The electronic device of claim 19, wherein:

the switching arrangement further comprises a first switching element coupled between the capacitive interface and the oscillator arrangement and a second switching element coupled between the reference capacitive element and the oscillator arrangement; and the processing module is configured to operate the first switching element and the second switching element in concert.

* * * * *